(12) United States Patent
Westerman

(10) Patent No.: US 6,867,635 B2
(45) Date of Patent: Mar. 15, 2005

(54) EXPANDABLE MULTIPORT TRANSFER SWITCH

(75) Inventor: Stephen J. Westerman, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 459 days.

(21) Appl. No.: 09/735,439

(22) Filed: Dec. 12, 2000

(65) Prior Publication Data

US 2002/0070790 A1 Jun. 13, 2002

(51) Int. Cl.[7] .................. H03K 17/62; H03K 17/76; H03K 17/693; H03K 17/735
(52) U.S. Cl. .................................. 327/416; 327/464
(58) Field of Search ................ 327/415–418, 327/403–404

(56) References Cited

U.S. PATENT DOCUMENTS

| | | | | |
|---|---|---|---|---|
| 4,813,041 A | * | 3/1989 | Reyneri | 370/112 |
| 5,293,087 A | * | 3/1994 | Hamano et al. | 327/558 |
| 5,347,239 A | * | 9/1994 | Loehner et al. | 333/81 R |
| 5,497,118 A | * | 3/1996 | Ueno et al. | 327/416 |
| 5,541,548 A | * | 7/1996 | Crafts | 257/202 |
| 5,548,239 A | * | 8/1996 | Kohama | 327/408 |
| 6,242,964 B1 | * | 6/2001 | Trask | 327/359 |

FOREIGN PATENT DOCUMENTS

JP          06085641       *  3/1994    ......... H03K/17/693

* cited by examiner

*Primary Examiner*—Quan Tra

(57) ABSTRACT

A transfer switch having a test signal input and first and second ports. The transfer switch includes a first routing switch and first and second port termination switches. The first routing switch has a routing switch input for receiving the test signal input and first and second outputs. Each output is connected to the routing switch input by a first switching element and each output is connected to ground by a second switching element. The first and second port termination switches are connected to the first and second outputs, respectively, of the first routing switch. Each termination switch includes a common-base transistor, and preferably, a Darlington amplifier with feedback. The common-base transistor is connected to the output of the routing switch and the Darlington amplifier has an output connected to a corresponding one of the first and second ports. The first and second switching elements are controlled such that only one of the first and second outputs is connected to the routing switch input at any given time. A transfer switch having 4 output ports can be constructed by including second and third routing switches and third and fourth port termination switches of the types described above. A transfer switch having $2^N$ output ports can be constructed by the successive addition of routing switches and port termination switches.

3 Claims, 5 Drawing Sheets

EXPANDABLE MULTIPORT TRANSFER SWITCH

FIELD OF THE INVENTION

The present invention relates to transfer switches, and more particularly, to an expandable transfer switch that is adapted for use in network analyzers and the like.

BACKGROUND OF THE INVENTION

In a network analyzer, a transfer switch connects the test signal source to one port of the device under test and terminates the remaining ports in a low-reflection load. The ideal transfer switch has a low, repeatable loss in the test signal path. In some cases, it is also advantageous to have gain in the signal path, provided the gain is stable and repeatable.

In addition, the transfer switch must provide a high degree of isolation in all of the terminated paths. Any signal leakage directly from the through path to the terminated paths bypasses the device under test and causes cross-talk. Further, for measurement accuracy, it is advantageous to have terminations that have identical impedance for each of the terminated paths. Finally, each port should have the same impedance whether that port is acting as a load or a source.

Broadly, it is the object of the present invention to provide an improved transfer switch.

These and other objects of the present invention will become apparent to those skilled in the art from the following detailed description of the invention and the accompanying drawings.

SUMMARY OF THE INVENTION

The present invention is a transfer switch having a test signal input and first and second output ports. The transfer switch includes a first routing switch and first and second port termination switches. The first routing switch has a routing switch input for receiving the test signal input and first and second outputs. Each output is connected to the routing switch input by a first switching element and each output is connected to ground by a second switching element. The first and second port termination switches are connected to the first and second outputs, respectively, of the first routing switch. Each termination switch includes a common-base transistor, and preferably, a Darlington amplifier with feedback. The common-base transistor is connected to the output of the routing switch and the Darlington amplifier has an output connected to a corresponding one of the first and second ports. The first and second switching elements are controlled such that only one of the first and second outputs is connected to the routing switch input at any given time. A transfer switch having 4 output ports can be constructed by including second and third routing switches and third and fourth port termination switches of the types described above. The second routing switch has a signal input for receiving the test signal input and first and second outputs, each output being connected to the signal input by a first switching element and each output being connected to ground by a second switching element. The third and fourth port termination switches are connected to the first and second outputs, respectively, of the second routing switch. Each termination switch includes a common-base transistor in series with a Darlington amplifier, the common-base transistor being connected to the output of the routing switch and the Darlington amplifier having an output connected to a corresponding one of the first and second ports. The third routing switch has a signal input for receiving the test signal input and first and second outputs, each output being connected to the signal input by a first switching element and each output being connected to ground by a second switching element. Each output of the third routing switch is connected to a corresponding one of the signal inputs of the second routing switch.

By repeatedly attaching 2 routing switches to each termination switch, the multiport transfer switch may be expanded to $2^N$ output ports, where N is any integer.

DETAILED DESCRIPTION OF THE INVENTION

Figure 1:
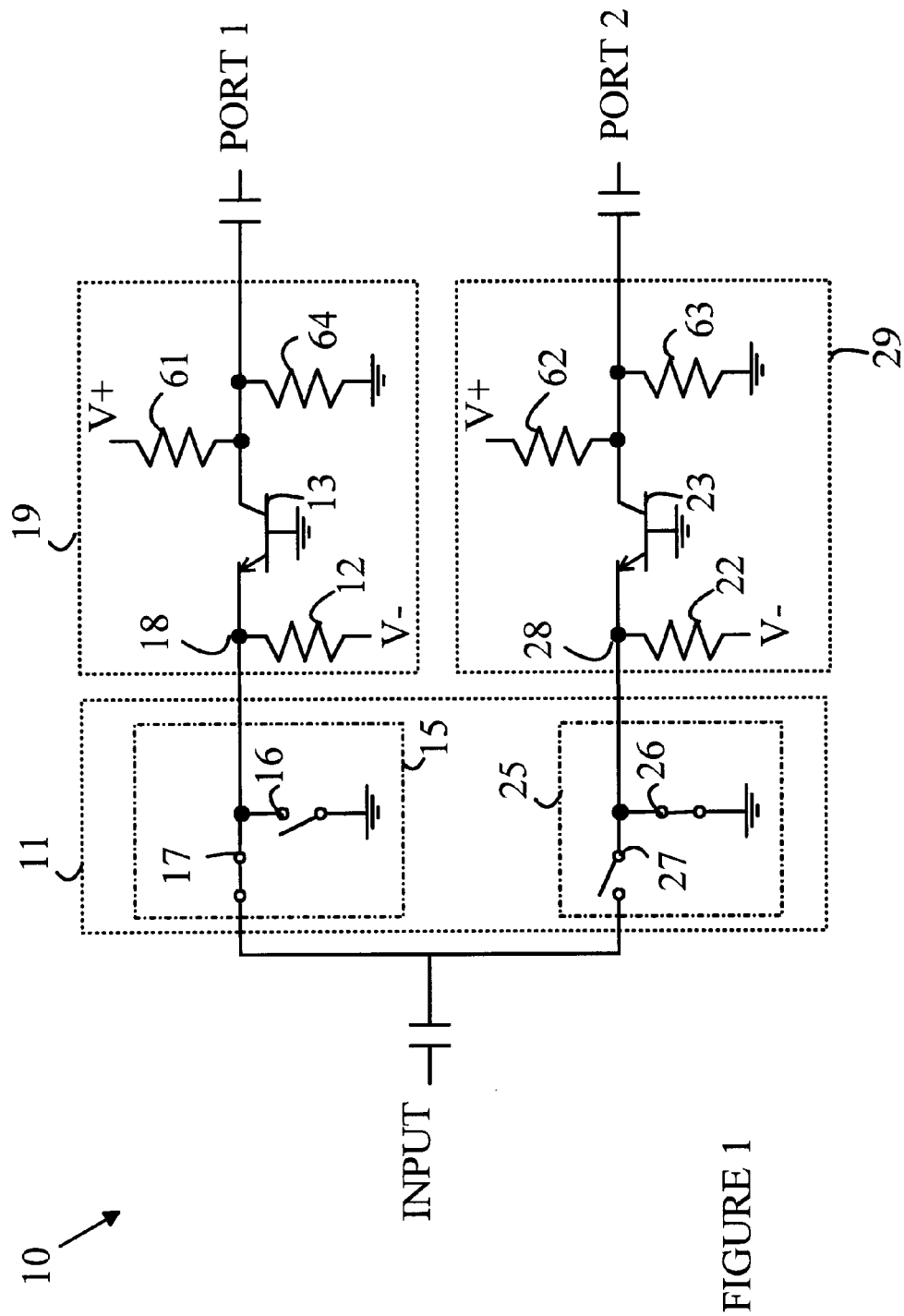
FIG. 1 is a schematic drawing of a two port transfer switch 10 according to the present invention.

The manner in which the present invention provides its advantages can be more easily understood with reference to FIG. 1, which is a schematic drawing of a two port transfer switch 10 according to the present invention. Switch 10 utilizes a routing switch 11 and two port termination switches 19 and 29. Routing switch 11 is constructed from two coupled dividers shown at 15 and 25. Each divider includes two switches shown at 16, 17, 26, and 27. The switches are coupled such that switch 16 and 26 are in opposite states with respect to one another, and switches 17 and 27 are also in opposite states with respect to one another. Similarly, switches 16 and 17 and switches 26 and 27 are in opposite states with respect to one another.

Refer now to divider 15. When switch 17 is closed and switch 16 is open, node 18 is biased at a negative potential and common-base transistor 13 is in a conducting state. The input signal is hence routed to port 1. In this configuration, divider 25 has switch 26 closed and switch 27 open. Hence, the signal is blocked by switch 27. The source impedance (output impedance) of port 1 in this configuration is approximately resistor 61 in parallel with resistor 64. In addition, node 28 is shorted to ground, and hence, common-base transistor 23 is non-conducting, which provides additional isolation. Port 2 will then have a termination provided by the parallel combination of resistor 62 and resistor 63. When the switch positions are reversed, port 1 will be terminated by resistor 61 in parallel with resistor 64, and port 2 will receive the signal, and have source impedance of approximately resistor 62 in parallel with resistor 63. Bias chain 61 and 62 provide the necessary bias to hold the collector of the common-base transistors at the proper value.

It should be noted that the output impedance at the collector of common-base transistors 13 and 23 is very high relative to the resistors attached to the collector, the source and load impedances at ports 1 and 2 are set largely by the resistors. In addition, the output impedance at the collector of the common-base transistors is very high whether the transistors are conducting or not. Hence, the source and load impedances at either port do not vary much between the sourcing state and the terminating state. This is an important criterion for a successful TRL (Through-Reflect-Line) calibration of a Vector Network Analyzer. Buffering the output of the termination switch with the modified Darlington amplifier further reduces the change in port impedance between common-base transistor conducting and nonconducting states.

It should be noted that a blocked signal path is blocked both by the open switch in the routing switch and the non-conducting common-base transistor in the port termination switch. As a result, very high levels of signal isolation are provided. For example, when the switches are constructed from GaAs FETs as described below, ON/OFF ratios of 100 dB can be obtained at lower microwave frequencies.

The voltage on node 18 also determines the gain of common base transistor 13. Hence, the gain associated with the "ON" path can be adjusted by controlling this bias voltage.

Figure 2:
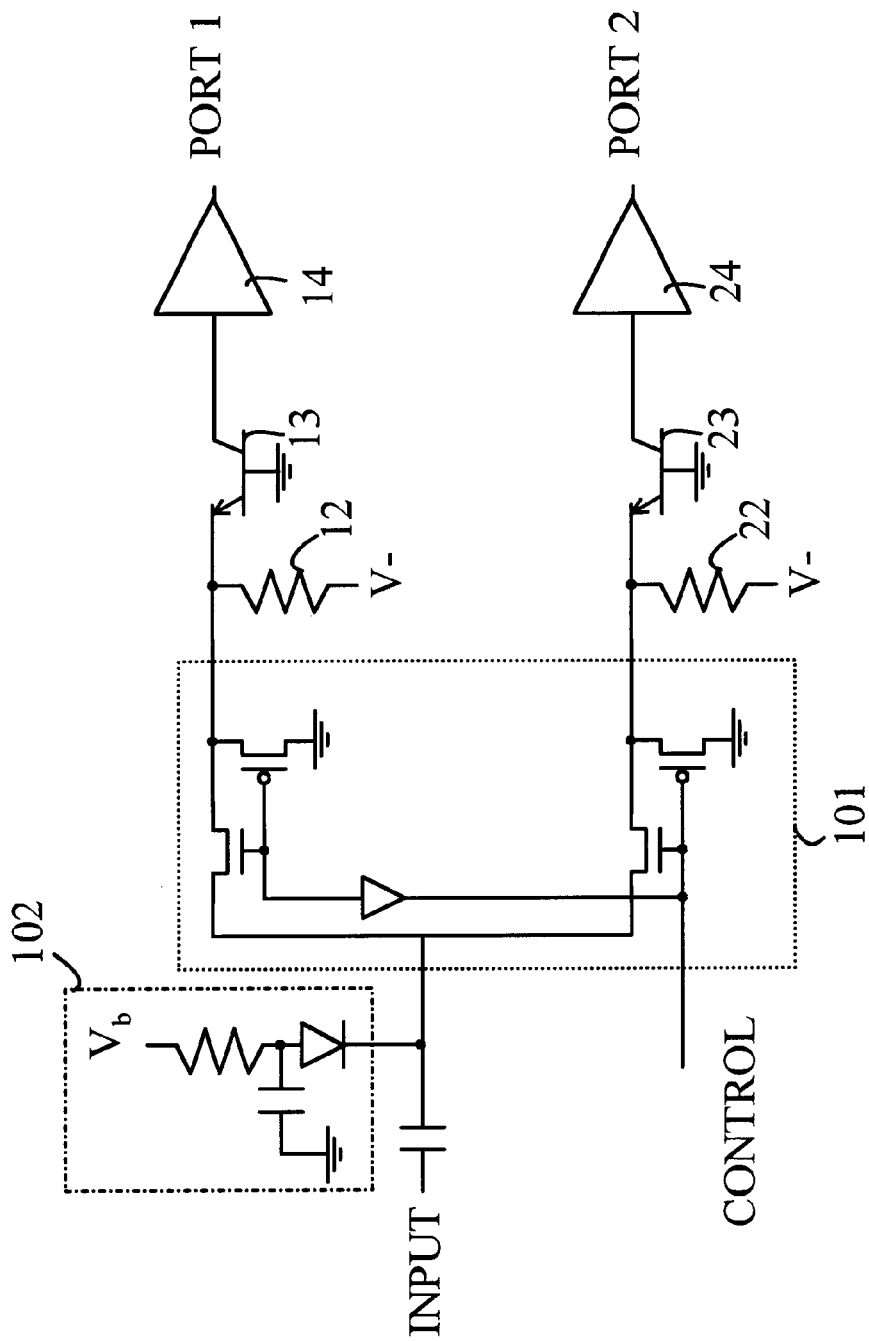
FIG. 2 is a schematic drawing of the embodiment shown in FIG. 1 in which the switches are implemented with FET transistors.

The switches are preferably implemented with FET transistors as shown in FIG. 2 at 101. To simplify the drawing, those elements that serve the same functions as elements shown in FIG. 1 have been given the same numeric designations. The FETs are preferably GeAsFETs to provide high-frequency operation. A bias chain 102 can be provided to set the gain of the "ON" path; the diode shown here will also supply a variable attenuation.

In the preferred embodiment of the present invention, the output impedance is set with a modified Darlington amplifier such as amplifiers 14 and 24. The amplifier provides both buffering and amplification of the signal that passes through the "ON" port. This amplification can be used to overcome any signal losses in the switch blocks. In addition, a Darlington amplifier with a feedback loop provides an output impedance that does not vary with the conduction state of the common-base transistor.

Figure 3:
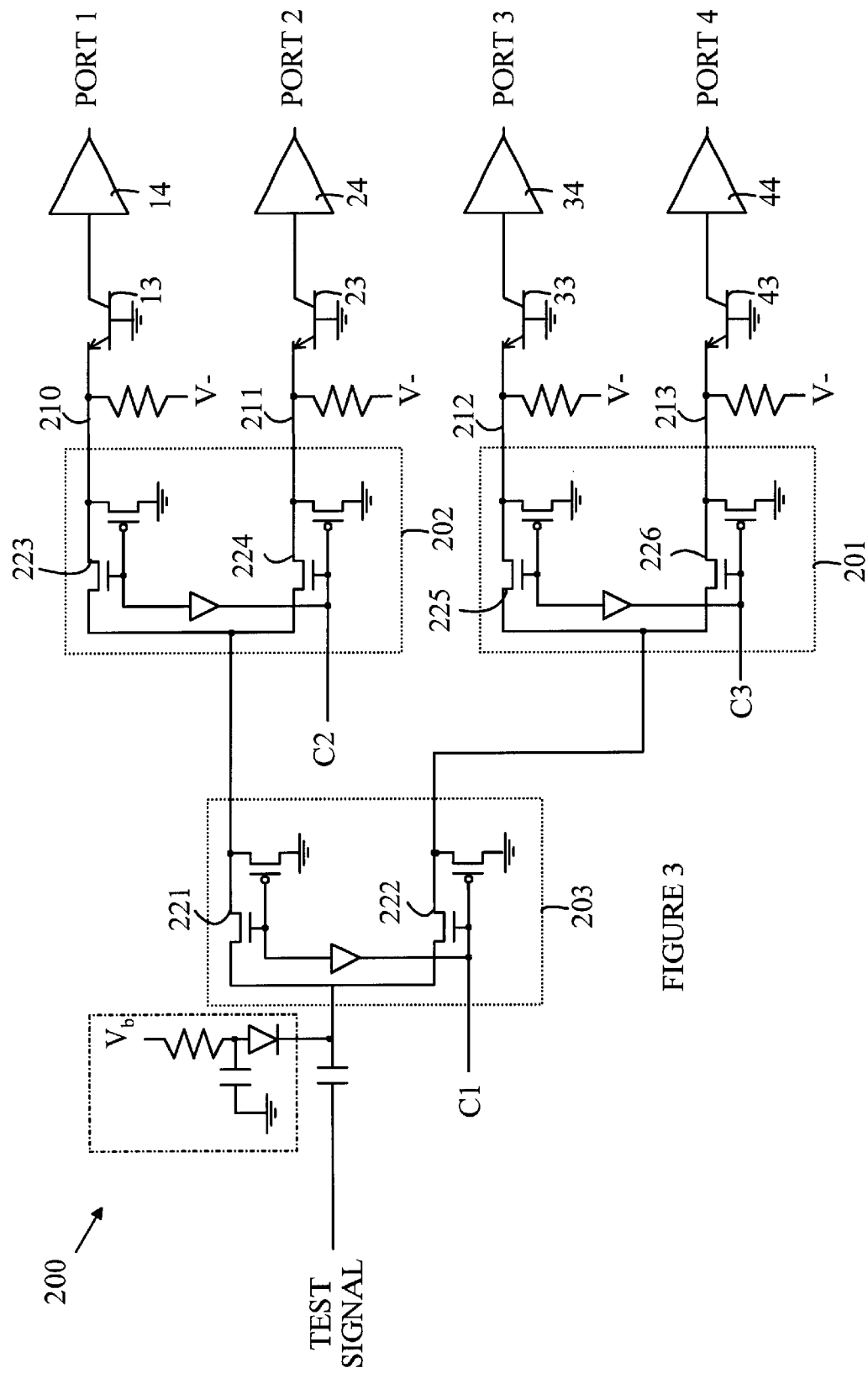
FIG. 3 is a schematic drawing of a 4-port transfer switch 200 according to the present invention.

The routing switch blocks can be cascaded to form a transfer switch having $2^N$ ports. Refer now to FIG. 3 which is a schematic drawing of a 4-port transfer switch 200 according to the present invention. Transfer switch 200 is constructed from three FET-based routing switches 201–203 that have been cascaded to provide 4 signal paths shown at 210–213. Each signal path terminates in a port termination switch constructed from a common-base transistor and a Darlington amplifier. The signal path that is used to route the signal to the desired output port is determined by control signals C1–C3. Consider the case in which the switches are set such that the signal is routed to signal path 210. In this case, switches 221 and 223 must be conducting, and hence switches 222 and 224 are in a non-conducting state. In addition, either switch 225 or switch 226 will be in a non-conducting state. For the purposes of this discussion, assume switch 225 is in the non-conducting state. In this case, Port 3 is isolated from the test signal input by two cascaded switch dividers and Ports 2 and 4 are isolated from the test signal input by one such divider in addition to the isolation provided by the port termination switches. In addition, all ports are isolated from all other ports by either one, two, or three switch dividers plus either one or two port termination switches. This isolation is important. For example, if port 2 receives a large input, a signal having a significant amplitude could leak from port 2 around to ports 3 or 4 in the absence of this isolation. Note also that switch divider 201 may be switched in a sequential fashion to increase the isolation from ports 1 and 2 to ports 3 and 4.

Figure 4:
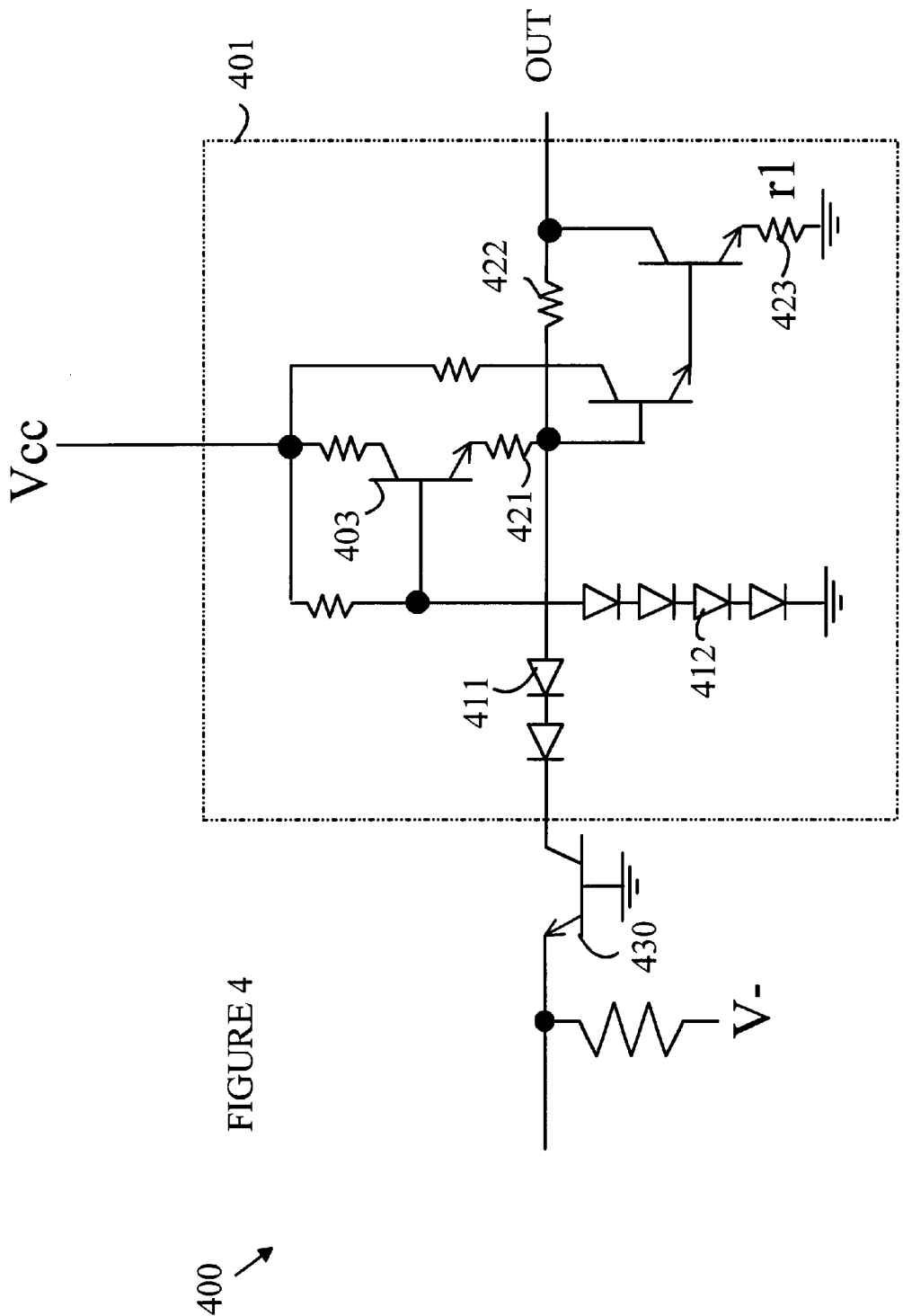
FIG. 4 is a simplified schematic drawing of the combination of the common-base transistor and the preferred Darlington amplifier.

A simplified schematic drawing of the common-base transistor and Darlington amplifier with feedback is shown in FIG. 4 at 400. The Darlington stage is shown at 401. The output impedance of the device is determined primarily by resistors 421–423. The diode stack shown at 412 sets the current through transistor 403. The diode stack shown at 411 sets the DC collector bias voltage of the common base transistor. If the common base transistor 430 is in a non-conducting state, the output impedance is set by the above mentioned resistors. If the common base transistor is conducting, these resistors will set the output impedance provided the impedance through the collector of common base transistor 430 is much greater than resistor 421.

Figure 5:
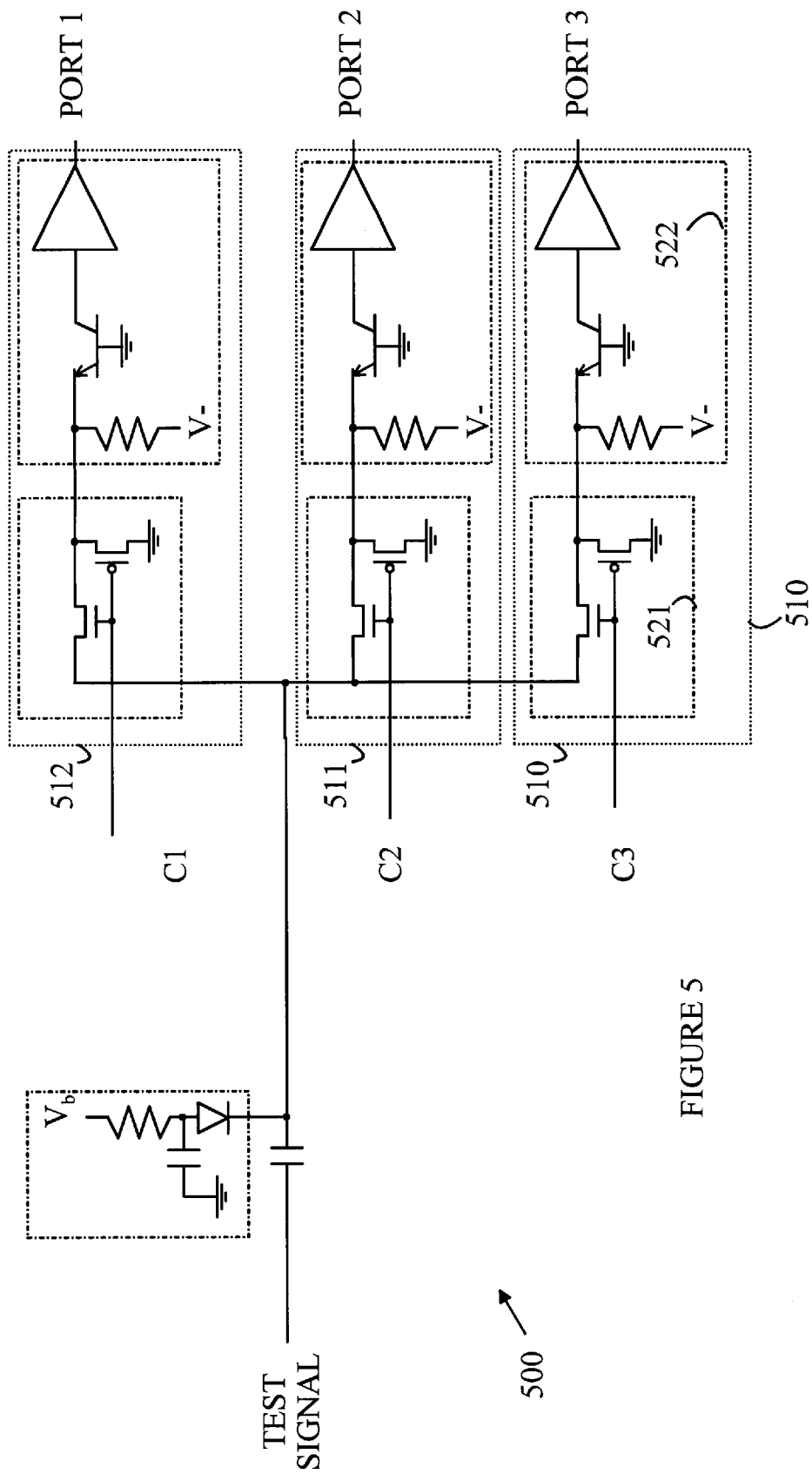
FIG. 5 is a schematic drawing of an embodiment of the present invention having 3 ports.

As noted above, the present invention can be used to construct a transfer switch having $2^N$ ports, where N is any positive integer. Such designs are particularly attractive because switching blocks having two conducting paths are commercially available (Agilent Technologies, Inc. HMMC-2006). However, the present invention can also be utilized to construct a transfer switch having M ports, where M is any positive integer. For example, a switch having 3 ports is shown in FIG. 5 at 500. Switch 500 is constructed from three switching elements 510–512. Each switching element includes a series-shunt switch and a port termination switch. An exemplary series-shunt-switch is shown at 521, and an exemplary port termination switch is shown at 522.

The above-described embodiments of the present invention have utilized power rails labeled $V_X$ and ground, it will be obvious to those skilled in the art from the preceding discussion that ground can be any AC, small-signal, or virtual ground. Accordingly the term "ground" as used herein is defined to include any AC, small-signal, or virtual ground.

Various modifications to the present invention will become apparent to those skilled in the art from the foregoing description and accompanying drawings. Accordingly, the present invention is to be limited solely by the scope of the following claims.

What is claimed is:

1. A transfer switch having a test signal input and first and second ports, said transfer switch comprising:

a first routing switch having a routing switch input for receiving said test signal input and first and second outputs, each output being connected to said routing switch input by a first switching element and each output being connected to ground by a second switching element; and first and second port termination switches connected to said first and second outputs, respectively, of said first routing switch, each termination switch comprising a common-base transistor, wherein each of said port termination switches further comprises a Darlington amplifier, said common-base transistor being connected to said output of said routing switch and said Darlington amplifier having an output connected to a corresponding one of said first and second ports.

2. The transfer switch of claim 1 wherein said Darlington amplifier further comprises a feedback loop for setting the output impedance of said port termination switch.

3. A transfer switch having a test signal input and first and second ports, said transfer switch comprising:

a first routing switch having a routing switch input for receiving said test signal input and first and second outputs, each output being connected to said routing switch input by a first switching element and each output being connected to ground by a second switching element;

first and second port termination switches connected to said first and second outputs, respectively, of said first routing switch, each termination switch comprising a common-base transistor;

a second routing switch having a signal input for receiving said test signal input and first and second outputs, each output being connected to said signal input by a first switching element and each output being connected to ground by a second switching element;

third and fourth port termination switches connected to said first and second outputs, respectively, of said second routing switch, each termination switch comprising a common-base transistor in series with a Darlington amplifier, said common-base transistor being connected to said output of said routing switch and said Darlington amplifier having an output connected to a corresponding one of said third and fourth ports; and a third routing switch having a signal input for receiving said test signal input and first and second outputs, each output being connected to said signal input by a first switching element and each output being connected to ground by a second switching element, wherein each output of said third routing switch is connected to a corresponding one of said signal inputs of said first and second routing switches.

* * * * *